US012615798B2

(12) United States Patent
Yun

(10) Patent No.: US 12,615,798 B2
(45) Date of Patent: Apr. 28, 2026

(54) HIGH VOLTAGE SEMICONDUCTOR DEVICE AND METHOD OF MANUFACTURING SAME

(71) Applicant: DB HiTek Co., Ltd., Bucheon-si (KR)

(72) Inventor: Ho Jin Yun, Icheon-si (KR)

(73) Assignee: DB HiTek Co., Ltd., Bucheon-si (KR)

( * ) Notice: Subject to any disclaimer, the term of this patent is extended or adjusted under 35 U.S.C. 154(b) by 559 days.

(21) Appl. No.: 18/180,840

(22) Filed: Mar. 8, 2023

(65) Prior Publication Data

US 2023/0343870 A1 Oct. 26, 2023

(30) Foreign Application Priority Data

Apr. 20, 2022 (KR) ........................ 10-2022-0048639

(51) Int. Cl.
H10D 30/65 (2025.01)
H10D 30/01 (2025.01)
H10D 30/60 (2025.01)

(52) U.S. Cl.
CPC ....... H10D 30/655 (2025.01); H10D 30/0285 (2025.01); H10D 30/603 (2025.01)

(58) Field of Classification Search
None
See application file for complete search history.

(56) References Cited

U.S. PATENT DOCUMENTS

| | | | |
|---|---|---|---|
| 6,268,626 B1 | 7/2001 | Jeon | |
| 8,754,474 B2 | 6/2014 | Ko | |
| 2012/0126322 A1 | 5/2012 | Ko | |
| 2012/0228704 A1* | 9/2012 | Ju | H10D 30/65 |
| | | | 257/E29.256 |
| 2016/0149007 A1* | 5/2016 | Chou | H10D 64/111 |
| | | | 257/339 |
| 2019/0221666 A1* | 7/2019 | Bang | H10D 64/62 |
| 2020/0105927 A1* | 4/2020 | Xu | H10D 30/603 |

FOREIGN PATENT DOCUMENTS

| | | |
|---|---|---|
| KR | 1020000051294 A | 8/2000 |
| KR | 1020060006596 A | 1/2006 |
| KR | 10-2012-0055139 A | 5/2012 |

OTHER PUBLICATIONS

Office Action, Application No. 10-2022-0048639, dated Nov. 20, 2025; Ministry of Intellectual Property (MOIP), Daejeon, South Korea.

* cited by examiner

*Primary Examiner* — Khaja Ahmad
(74) *Attorney, Agent, or Firm* — Central California IP Group, P.C.; Andrew D. Fortney

(57) ABSTRACT

Disclosed is a high voltage semiconductor device. More particularly, a high voltage semiconductor device is disclosed, including a slope compensating structure on at least a portion of an outermost surface of a gate spacer defining a sidewall of a gate structure, thereby reducing or preventing electric field concentration in a corner of a gate field plate, and thus improving reliability of the device.

8 Claims, 9 Drawing Sheets

HIGH VOLTAGE SEMICONDUCTOR DEVICE AND METHOD OF MANUFACTURING SAME

CROSS REFERENCE TO RELATED APPLICATION

The present application claims priority to Korean Patent Application No. 10-2022-0048639, filed Apr. 20, 2022, the entire contents of which are incorporated herein for all purposes by this reference.

BACKGROUND OF THE INVENTION

Field of the Invention

The present disclosure relates generally to a high voltage semiconductor device. More particularly, the present disclosure relates to a high voltage semiconductor device, including a slope compensating structure on at least a portion of an outermost surface of a gate spacer defining a sidewall of a gate structure, thereby reducing or preventing electric field concentration in a corner of a gate field plate, and thus improving reliability of the device.

Description of the Related Art

A lateral double diffused metal oxide semiconductor (LDMOS) device is a representative horizontal type electric device with a fast switching response and high input impedance. Hereinafter, the structure and problems of a field plate and an LDMOS device having an STI under the field plate will be described in detail.

FIG. 1 is a cross-sectional view illustrating a high voltage LDMOS device 9 according to the related art.

Referring to FIG. 1, the LDMOS device 9 according to the related art includes an insulating pattern 930 on a gate structure 910, and a field plate 950 on the insulating pattern 930. The insulating pattern 930 may comprise a silicon dioxide film or layer. In this structure, low on-resistance can be ensured through the field plate 950.

The gate structure 910 includes agate insulating film 911 on a substrate 901, agate electrode 913 on the gate insulating film 913, and a sidewall spacer 915 on each sidewall of the gate electrode 913. Briefly describing the process of forming the sidewall spacer 915, after formation of the gate insulating film 911 and the gate electrode 913, an insulating film or layer is deposited on the substrate 901 to cover the gate electrode 913 and is then etched.

FIG. 2 is a scanning electron microscope (SEM) image of the sidewall spacer 915 of the high voltage LDMOS device 9 illustrated in FIG. 1.

Referring to FIG. 2, an outermost surface of the sidewall spacer 915 includes an upper portion 915a that has a relatively small or shallow slope and that may be slightly rounded, and a lower portion 915b that extends obliquely from the upper portion 915a. Due to the shape of the lower portion 915b, a corner of the insulating pattern 930 covering the sidewall spacer 915 has a portion with a steep slope. As a result, since the field plate 950 on the insulating pattern 930 also has a portion with a steep slope, an electric field may concentrate in the corner of the field plate 950 (see, e.g., the angled inner surface of the field plate 950 indicated by the reverse "L"-like symbol in FIG. 2). This electric field concentration becomes a major factor in deterioration in the breakdown voltage characteristics of the device and consequent deterioration in the overall reliability of the device.

The foregoing is intended merely to aid in the understanding of the background of the present disclosure, and is not intended to mean that the present disclosure falls within the purview of the related art that is already known to those skilled in the art.

DOCUMENTS OF RELATED ART

Korean Patent Application Publication No. 10-2012-0055139, entitled "LDMOS semiconductor device."

SUMMARY OF THE INVENTION

To overcome the above problem(s), the present inventors have conceived a novel high voltage semiconductor device having an improved structure and a method of manufacturing the same, described in detail below.

Accordingly, the present disclosure has been made keeping in mind the above problems occurring in the related art, and an objective of the present disclosure is to provide a high voltage semiconductor device and a method of manufacturing the same that compensate for a steep slope of an outermost surface of a gate spacer defining a sidewall of a gate structure by including a slope compensating structure on at least a portion of the outermost surface of the gate spacer, thereby reducing or preventing electric field concentration in a corner of an overlying gate field plate, and thus improving reliability of the device.

Another objective of the present disclosure is to provide a high voltage semiconductor device and a method of manufacturing the same, including an insulating film on a semiconductor layer or substrate and a slope compensating structure, which may be formed by an etch-back process without a separate mask pattern. The slope compensating structure (and optionally, the insulating film) may reduce or prevent any deterioration in the efficiency of the device manufacturing process.

Another objective of the present disclosure is to provide a high voltage semiconductor device and a method of manufacturing the same, including a drain extension region surrounding a drain of the device, thereby reducing or preventing elongation of a current path between a source of the device and the drain.

In order to achieve the above objectives, according to one aspect of the present disclosure, there is provided a high voltage semiconductor device including a semiconductor layer or substrate; a gate structure on the semiconductor layer or substrate; a slope compensating structure on an outer wall or surface of the gate structure; an insulating pattern on the gate structure and the slope compensating structure; and a gate field plate on the insulating pattern, and optionally, over the slope compensating structure.

According to another aspect of the present disclosure, the gate structure may include a gate insulating film on the semiconductor layer or substrate; a gate electrode on the gate insulating film; and a gate spacer on a sidewall of the gate electrode.

According to another aspect of the present disclosure, the gate spacer may include a first curved portion (e.g., having a curved uppermost surface); and a second portion extending from the first portion with a steeper slope than the first portion, and the slope compensating structure may be on at least a portion of an outermost surface of the second portion.

According to another aspect of the present disclosure, the slope compensating structure may include an insulating material, and the insulating pattern may have a portion extending from the surface of the semiconductor layer or substrate to an upper surface of the gate electrode.

According to another aspect of the present disclosure, the slope compensating structure may have an outermost surface having a gentler slope than the outermost surface of the second portion.

According to another aspect of the present disclosure, there is provided a high voltage semiconductor device including a semiconductor layer or substrate; a drift region in the semiconductor layer or substrate; a body region in the semiconductor layer or substrate; a drain in the drift region; a source in the body region; a gate structure on the semiconductor layer or substrate; a slope compensating structure on an outer wall or surface of the gate structure; an insulating pattern on the gate structure and the slope compensating structure and covering the slope compensating structure; and a gate field plate on the insulating pattern. The gate structure may include a gate insulating film on the semiconductor layer or substrate; a gate electrode on the gate insulating film; and a gate spacer on a sidewall of the gate electrode, and the slope compensating structure may be in contact with a lower portion of an outermost surface of the gate spacer on the semiconductor layer or substrate.

According to another aspect of the present disclosure, the high voltage semiconductor device may further include a drain extension region in the drift region and surrounding the drain.

According to another aspect of the present disclosure, the high voltage semiconductor device may further include a body contact in the body region and in contact with the source; and an LDD region in the body region and in contact with the source.

According to another aspect of the present disclosure, the gate spacer may include a first portion (which may be an upper portion of the gate spacer, and which may have an outermost surface with a curved and/or relatively gentle slope); and a second portion extending from the first portion, having an outermost surface with a steeper slope than that of the first portion, and the slope compensating structure may have an outermost surface having a gentler slope than an outermost surface of the second portion.

According to another aspect of the present disclosure, the insulating pattern may be in contact with the entire outermost surface of the slope compensating structure.

According to another aspect of the present disclosure, there is provided a method of manufacturing a high voltage semiconductor device, the method including forming a gate structure on a semiconductor layer or substrate between a source and a drain (e.g., of the high voltage semiconductor device); forming a slope compensating structure on at least a portion of an outer wall or surface of the gate structure; forming an insulating pattern on the gate structure and the semiconductor layer or substrate, wherein the insulating pattern covers the slope compensating structure; and forming a gate field plate on the insulating pattern.

According to another aspect of the present disclosure, forming the gate structure may include forming a gate insulating film on the semiconductor layer or substrate; forming a gate electrode on the gate insulating film; and forming a gate spacer on a sidewall of the gate electrode. in such an aspect, the slope compensating structure may be formed on a lower portion of an outermost surface of the gate spacer.

According to another aspect of the present disclosure, the gate spacer may include a first curved portion (e.g., having a curved uppermost surface); and a second portion extending from the first portion and having a steeper slope than the first portion. The slope compensating structure may be on the semiconductor layer or substrate and may have a height equal to or less than a height of the second portion (e.g., of the gate spacer).

According to another aspect of the present disclosure, forming the slope compensating structure may include depositing an insulating film on the semiconductor layer or substrate to cover the gate structure; and etching the insulating film.

According to another aspect of the present disclosure, there is provided a method of manufacturing a high voltage semiconductor device, the method including sequentially forming an insulating film or layer on a semiconductor layer or substrate and depositing a gate film on the insulating film or layer; sequentially etching the gate film and the insulating film or layer to form a gate electrode and a gate insulating film; depositing a first insulating film on the semiconductor layer or substrate and the gate electrode; etching the first insulating film to form a gate spacer; depositing a second insulating film on the semiconductor layer or substrate, the gate electrode, and gate spacer; etching the second insulating film to form a slope compensating structure; and forming an insulating pattern and a gate field plate on at least a part of the gate electrode and on the slope compensating structure.

According to another aspect of the present disclosure, forming the insulating pattern and the gate field plate may include sequentially depositing a third insulating film and a plate film on the semiconductor layer or substrate, the gate electrode, and the slope compensating structure; and etching the third insulating film and the plate film. Etching the third insulating film and the plate film may comprise patterning a mask on the plate film, etching areas of the plate film and the third insulating film exposed by the mask, then removing the mask.

According to another aspect of the present disclosure, the slope compensating structure may have an outermost surface having a gentler slope than an outermost surface of a lower portion of the gate spacer.

According to another aspect of the present disclosure, the method may further include forming a drift region in the semiconductor layer or substrate; and forming a body region in the semiconductor layer or substrate. The body region may be in the drift region.

According to another aspect of the present disclosure, the slope compensating structure may comprise a nitride film (e.g., silicon nitride).

The present disclosure has the following effects by the above configuration.

In order to compensate for the relatively steep slope of the outermost surface of the gate spacer defining a sidewall of a gate structure, the slope compensating structure on at least a portion of the outermost surface of the gate spacer enables reduction or prevention of an electric field concentration in a corner of the gate field plate, and thus, enables improved reliability of the device.

Furthermore, by forming or including an insulating film on the semiconductor layer or substrate and then forming the slope compensating structure by an etch-back process without a separate mask pattern, it is possible to maintain the efficiency of the device manufacturing process (e.g., relative to the same process that does not form or include the slope compensating structure).

Furthermore, by forming or including a drain extension region surrounding the drain of the device, it is possible to reduce or prevent elongation of a current path between the source of the device and the drain.

Meanwhile, the effects of the present disclosure are not limited to the effects described above, and other effects not stated directly can be understood from the following description and claims.

BRIEF DESCRIPTION OF THE DRAWINGS

The above and other objectives, features, and other advantages of the present disclosure will be more clearly understood from the following detailed description when taken in conjunction with the accompanying drawings, in which.

DETAILED DESCRIPTION OF THE INVENTION

Figure 1:
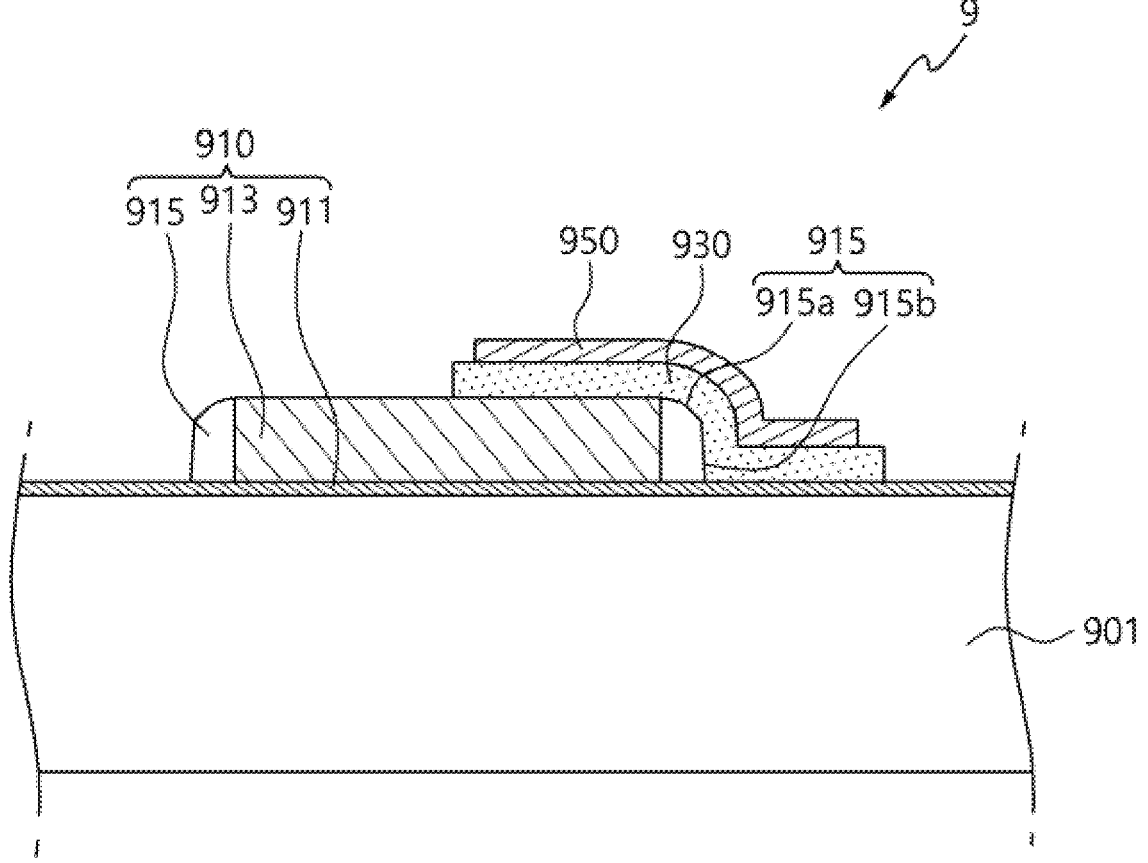
FIG. 1 is a cross-sectional view illustrating a high voltage semiconductor device according to the related art.
Figure 2:
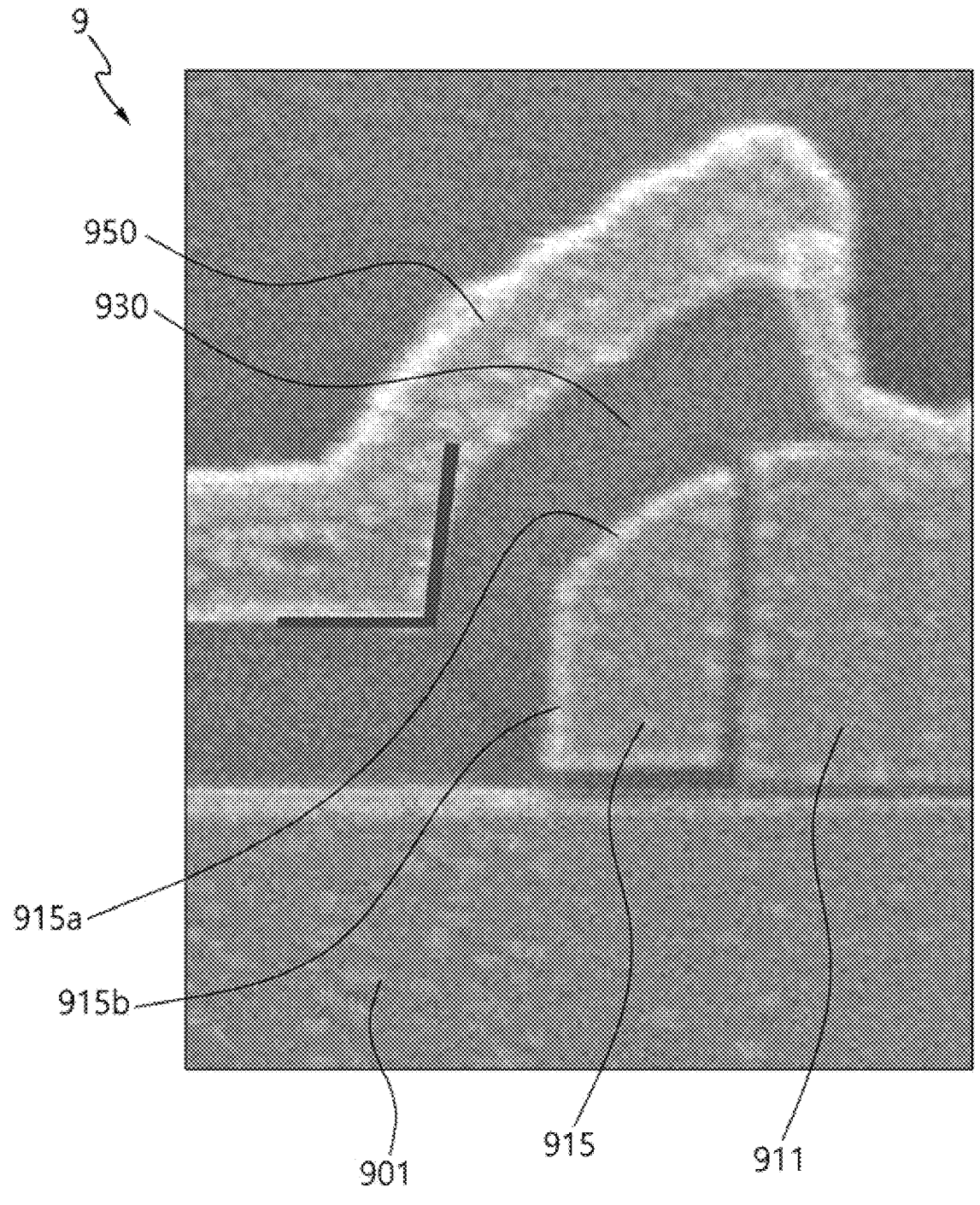
FIG. 2 is a scanning electron microscope (SEM) image of a sidewall of the high voltage semiconductor device illustrated in FIG. 1.

Hereinafter, exemplary embodiments of the present disclosure will be described in more detail with reference to the accompanying drawings. The embodiments of the present disclosure can be modified in various forms. Therefore, the scope of the present disclosure should not be construed as being limited to the following embodiments, but should be construed on the basis of the descriptions in the appended claims. The embodiments of the present disclosure are provided for completeness of the present disclosure and to fully convey the scope of the present disclosure to those skilled in the art.

As used herein, the singular forms are intended to include the plural forms as well, unless the context clearly indicates otherwise. It will be further understood that the terms "comprise" and/or "comprising", etc., when used in this specification, specify the presence of stated features, integers, steps, operations, elements, components, and/or combinations thereof, but do not preclude the presence or addition of one or more other features, integers, steps, operations, elements, components, and/or combinations thereof.

As used herein, when an element (or layer) is referred to as being on another element (or layer), it can be directly on the other element, or one or more intervening elements (or layers) may be therebetween. In contrast, when an element is referred to as being directly on or above another component, no intervening elements are therebetween. Further, the terms "on", "above", "below", "upper", "lower", "one side", "side surface", etc. are used to describe one element's positional relationship to one or more other elements illustrated in the drawings.

In the embodiments described below, a first conductivity type may be one of P-type and N-type (e.g., P-type), and a second conductivity type may be the other of P-type and N-type (e.g., N-type), for example, but are not necessarily limited thereto.

Figure 3:
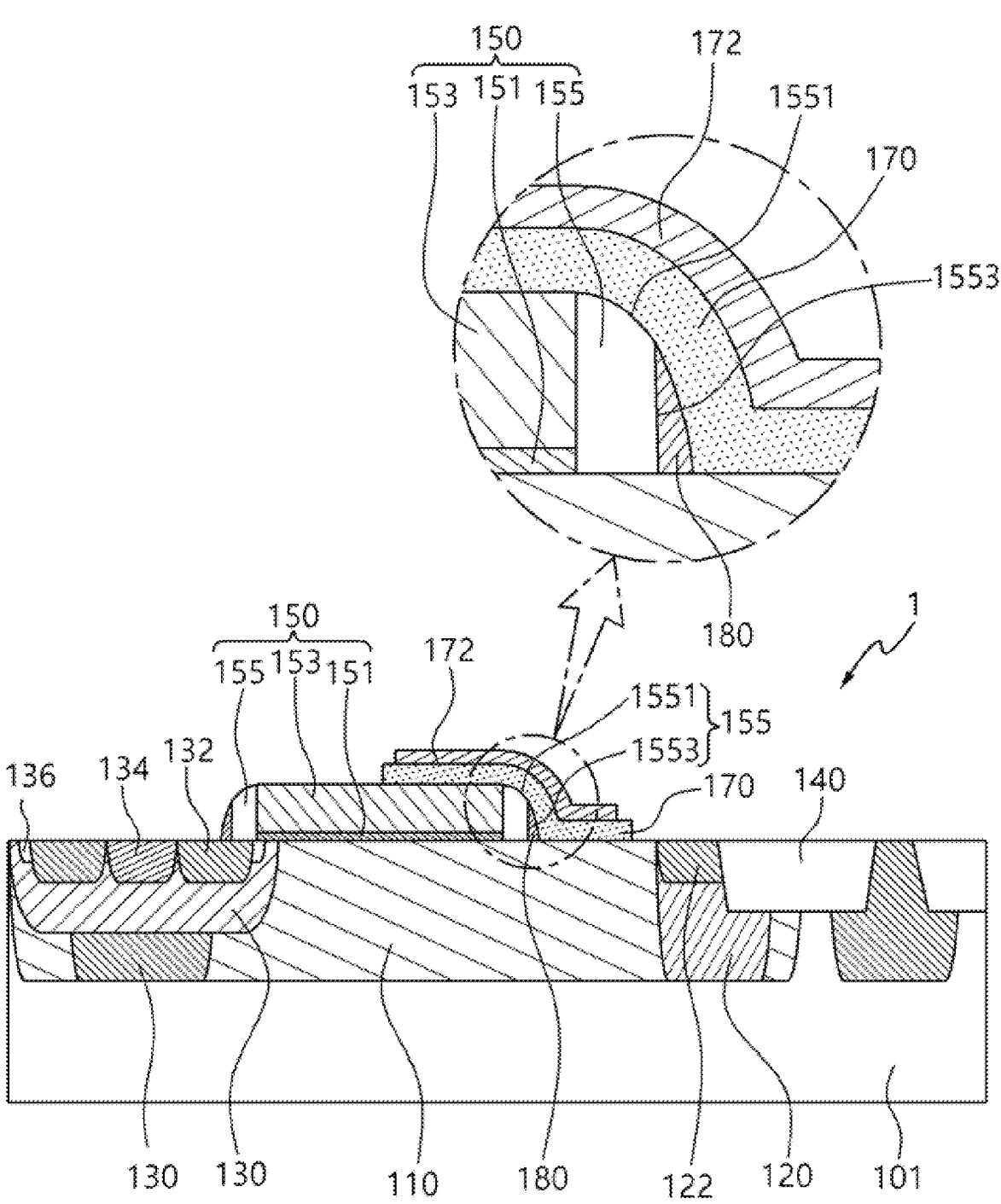
FIG. 3 is a cross-sectional view illustrating a high voltage semiconductor device according to an embodiment of the present disclosure.
Figure 4:
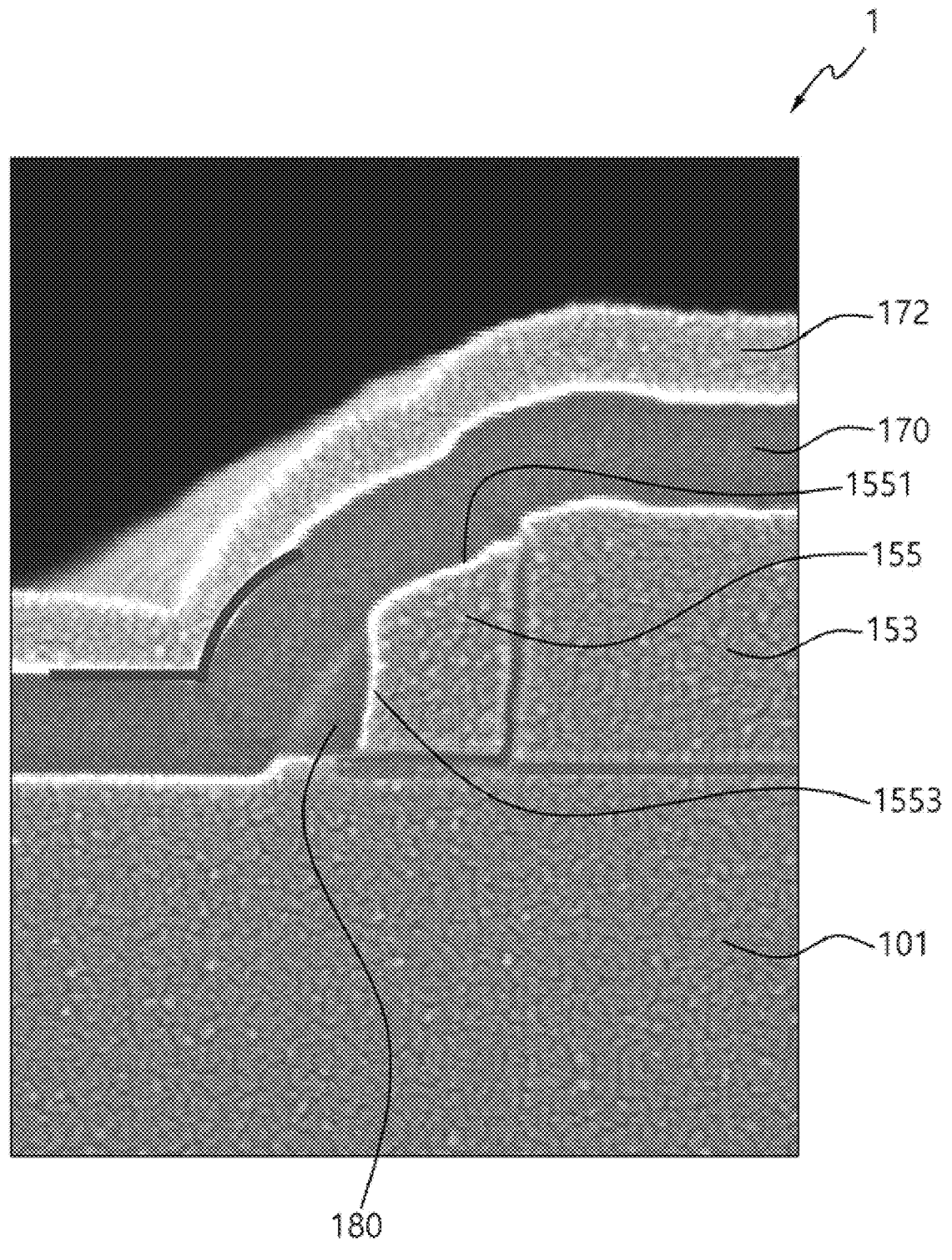
FIG. 4 is a SEM image of a gate spacer in the high voltage semiconductor device illustrated in FIG. 3.

FIG. 3 is a cross-sectional view illustrating a high voltage semiconductor device 1 according to an embodiment of the present disclosure; and FIG. 4 is a SEM image of a gate spacer 155 in the high voltage semiconductor device 1 illustrated in FIG. 3.

Hereinafter, the high voltage semiconductor device 1 according to the embodiment of the present disclosure will be described in detail with reference to the accompanying drawings. The above-described high voltage semiconductor device 1 may be, but is not limited to, for example, an LDMOS device.

The present disclosure relates generally to the high voltage semiconductor device 1. More particularly, the present disclosure relates to the high voltage semiconductor device 1, including a slope compensating structure 180 on at least a portion of an outermost surface of the gate spacer 155 defining a sidewall of a gate structure 150. The slope compensating structure 180 reduces or prevents electric field concentration in a corner of or a sharp bend in the gate field plate 172, thus improving reliability of the device 1.

First, the semiconductor device 1 may include a semiconductor layer or substrate 101. The semiconductor layer or substrate 101 may comprise a semiconductor substrate having a first conductivity type or a semiconductor-on-insulator (SOI) substrate. In the latter case, the SOI substrate may comprise a semiconductor layer on an insulating layer, and the semiconductor layer may have the first conductivity type. Alternatively, the semiconductor layer semiconductor layer 101 may include, but not be limited to, an epitaxial layer having the first conductivity type on a single-crystal or monolithic silicon wafer. A well region (not shown, but which may function as or define an active region of the device) may be in the semiconductor layer or substrate 101. The active region may be (further) defined by a device isolation layer 140.

A drift region 110 may be in the semiconductor layer or substrate 101. The drift region 110 may comprise a doped region having a second conductivity type. The drift region 110 may have a relatively low doping concentration compared to the drain 122, which will be described later. When the doping concentration in the drift region 110 is equal to or less than a certain level, the on-resistance (Rsp) characteristics may deteriorate. On the contrary, when the doping concentration is greater than the certain level, the on-resistance (Rsp) characteristics may improve, but the breakdown voltage (BV) characteristics may deteriorate. In view of this, it is preferable for the drift region 110 to have an appropriate level of doping (or dopant concentration), considering the corresponding device characteristics.

In addition, the drift region 110 may surround a body region 130 as illustrated in the drawings, or may be isolated from the body region 130, but is not limited thereto. The drift region 110 may surround the drain 122.

The drain 122 may comprise a doped region having the second conductivity type, and may have a relatively high doping concentration compared to the drift region 110. The drain 122 may be electrically connected to a drain contact or plug (not illustrated). Also, the drain 122 may be surrounded by a drain extension region 120 in the drift region 110. That is, the drain extension region 120 may be in the drift region 110, and the drain 122 may be in (and/or through) the drain extension region 120. The drain extension region 120 may comprise a doped region having the second conductivity type. The drain extension region 120 may prevent elongation of a current path between a source 132, which will be described later, and the drain 122.

The body region 130 may be in the semiconductor layer or substrate 101. The body region 130 may comprise a doped region having the first conductivity type. The body region 130 may have a portion extending to the bottom of the drift region 110. The source 132 and a body contact 134 may be in the body region 130. The source 132 may be a heavily doped region having the second conductivity type, and the body contact 134 may be a heavily doped region having the first conductivity type. Also, the body contact area 134 may be in contact with the source 132. The source 132 may be electrically connected to a source contact or plug (not illustrated).

In addition, a high voltage lightly doped drain (LDD) region 136 having the second conductivity type may be in the body region 130. The LDD region 136 may overlap the source 132, may be in the body region 130, and may be at an uppermost surface of the semiconductor layer or substrate 101. Also, the LDD region 136 is preferably shallower than the source 132 and the body contact 134.

Next, the device isolation layer 140 may be in the semiconductor layer or substrate 101 at a position in contact with the drain 122. The device isolation layer 140 may define (at least in part) a well region (not shown) that may function as an active region of the semiconductor layer or substrate 101. The device isolation layer 140 may be formed by, for example, a shallow trench isolation (STI) process, but is not limited thereto.

The gate structure 150 may be on the uppermost surface of the semiconductor layer or substrate 101. The gate structure 150 may be between the drain 122 and the source 132. In detail, the gate structure 150 may comprise a gate insulating film 151 on the semiconductor layer or substrate 101, and a gate electrode 153 on the gate insulating film 151. The gate insulating film 151 may comprise, for example, an oxide film or layer (e.g., undoped and/or thermally-grown silicon dioxide). The gate electrode 153 may be formed, for example, by depositing and patterning a polysilicon film, but is not limited thereto. In addition, the gate spacer 155 may be formed on each sidewall of the gate electrode 153. The gate spacer 155 may comprise, for example, an oxide film (e.g., silicon dioxide), a nitride film (e.g., silicon nitride), or a combination thereof (e.g., silicon oxynitride or a silicon nitride-on-silicon dioxide bilayer). The gate electrode 153 may be electrically connected to a gate contact or plug (not illustrated).

The gate spacer 155 may be formed, for example, by depositing a first insulating film 156 on the surface of the semiconductor layer or substrate 101 and the gate electrode 153 and then etching (e.g., anisotropically etching) the deposited first insulating film 156. Here, an outermost surface of the gate spacer 155 may comprise a first portion 1551 (which may be, e.g., curved or convex), and a second portion 1553 extending relatively steeply from the first portion 1551. The first portion 1551 is curved and has a relatively gentle or small slope, whereas the second portion 1553 extends substantially vertically or with a relatively steep or large slope compared to the first portion 1551.

In addition, an insulating pattern 170 may be on the gate electrode 153, the gate spacer 155, and the semiconductor layer or substrate 101. The insulating pattern 170 may extend to upper surfaces of the gate spacer 155 and the gate electrode 153 from the surface of the semiconductor layer or substrate 101 that vertically overlaps the drift region 110. The insulating pattern 170 may comprise, but is not limited to, for example, a nitride film (e.g., silicon nitride). The shape of a portion of the insulating pattern 170 (a corner of and/or sharp bend in the insulating pattern 170) on or adjacent to the gate spacer 155 may depend on the shape of the gate spacer 155.

In addition, the gate field plate 172 may be on the insulating pattern 170. The gate field plate 172 may comprise, but is not limited to, a conductive material such as polysilicon, tungsten, aluminum, copper, or a combination thereof (e.g., tungsten silicide). A corner of the gate field plate 172 may have a shape similar or complementary to the corner of the insulating pattern 170. Also, the gate field plate 172 may be electrically connected to a gate field plate contact or plug (not illustrated).

As described above, the outermost surface of the gate spacer 155 may comprise the first portion 1551 and the second portion 1553, extending relatively steeply from the first portion 1551. In this structure, when the corner of the insulating pattern 170 is in direct contact with the gate spacer 155 (that is, when there is no separate structure between the gate spacer 155 and the corner of the insulating pattern 170), the lowermost surfaces of each of the insulating pattern 170 and the gate field plate 172 have a portion that extends steeply downward towards the corners, corresponding to the second portion 1553 of the gate spacer 155. Due to such a drastic change in slope (e.g., at the corner or sharp bend), an electric field may concentrate in the corner of the gate field plate 172. This electric field concentration may become a major factor in the deterioration of the breakdown voltage characteristics of the device 1 and consequent deterioration in the overall reliability of the device 1.

To overcome the above problem, the present disclosure includes a device comprising the slope compensating structure 180 on at least a portion of an outermost surface of the second portion 1553 of the gate spacer 155. The slope compensating structure 180 may comprise, but is not limited to, for example, any insulating film such as an oxide (e.g., silicon dioxide) film or a nitride (e.g., silicon nitride) film. The slope compensating structure 180 may have an outermost surface with a gentler slope than that of the second portion 1553. Thus, since the insulating pattern 170 on the slope compensating structure 180 and the gate spacer 155 may extend along the slope compensating structure 180, the innermost surface of each of the insulating pattern 170 and the gate field plate 172 along the outermost surface of the slope compensating structure 180 may have a relatively gentle slope, smaller than that of the outermost surface of the slope compensating structure 180 (see FIG. 4). With this structure, electric field concentration in the corner of the gate field plate 172 can be reduced or alleviated. In addition, the slope compensating structure 180 may be formed by depositing the insulating film 181 and then etching the deposited insulating film 181 without using a separate mask. Since the slope compensating structure 180 may be formed from the residual deposited insulating film 180 remaining after etching, process efficiency can be maintained.

The slope compensating structure 180 may not overlap the first portion 1551 laterally, but is not limited thereto. In addition, it is preferable that the outermost surface of the slope compensating structure 180 has a gentler or smaller slope than the outermost surface of the second portion 1553.

FIGS. 5 to 12 are reference cross-sectional views illustrating a method of manufacturing a high voltage semiconductor device according to one or more embodiments of the present disclosure.

Hereinafter, the method of manufacturing the high voltage semiconductor device according to the embodiment of the present disclosure will be described in detail with reference to the accompanying drawings. Each step may be performed in a sequence different from that described herein, and a plurality of arbitrary steps may be performed substantially simultaneously, but the present disclosure is not limited thereto. In addition, for convenience of description, a process of forming a source, etc. in a semiconductor layer or substrate 101 will be omitted, and a process performed on the semiconductor layer or substrate 101 will be mainly described in detail.

Figure 5:
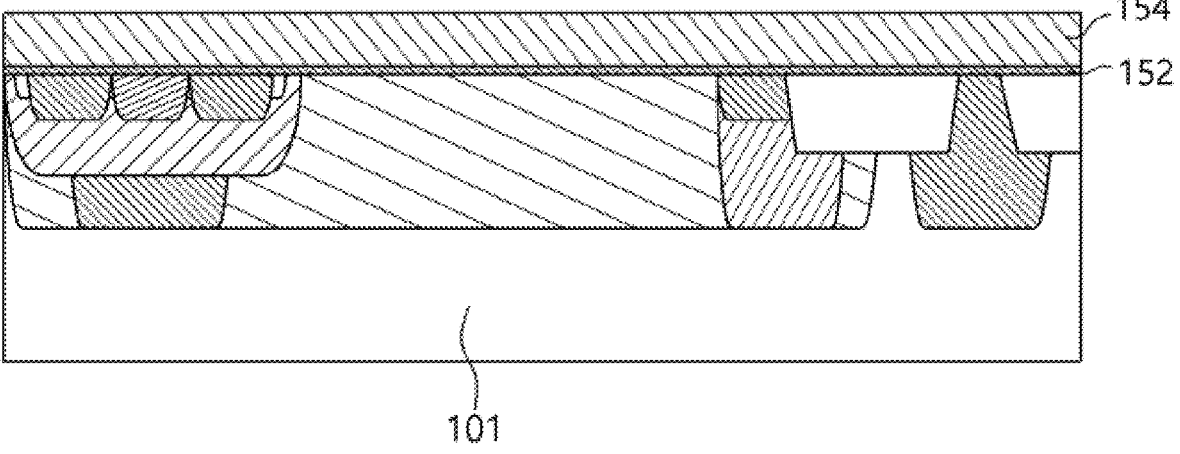
FIGS. 5 to 12 are reference cross-sectional views illustrating structures formed during a method of manufacturing a high voltage semiconductor device according to one or more embodiments of the present disclosure.

First, a gate structure 150 may be formed on the semiconductor layer or substrate 101. This will be described in detail. Referring to FIG. 5, an insulating film or layer 152 may be formed on the semiconductor layer or substrate 101, for example by wet or dry thermal growth (e.g., of silicon dioxide) or by blanket deposition (e.g., of a high k dielectric such as hafnium silicate, zirconium silicate, hafnium dioxide or zirconium dioxide, by atomic layer deposition). A gate film 154 may be formed on the insulating film or layer 152, for example by blanket deposition (e.g., plasma-assisted deposition using silane gas). The insulating film or layer 152 may comprise, for example, an oxide film or layer (e.g., silicon dioxide, hafnium dioxide or zirconium dioxide), and the gate film 154 may comprise, for example, a polysilicon film.

Figure 6:
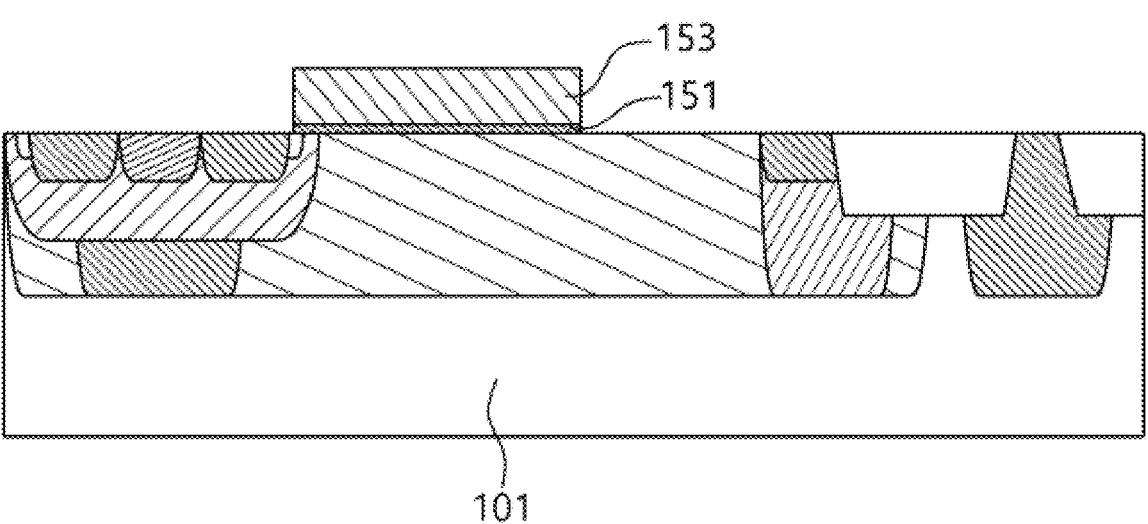

Then, referring to FIG. 6, after forming a mask pattern (not illustrated) on the gate film 154, the gate film 154 and the insulating film or layer 152 may be sequentially etched through openings in the mask pattern to form a gate insulating film 151 and a gate electrode 153.

Figure 7:
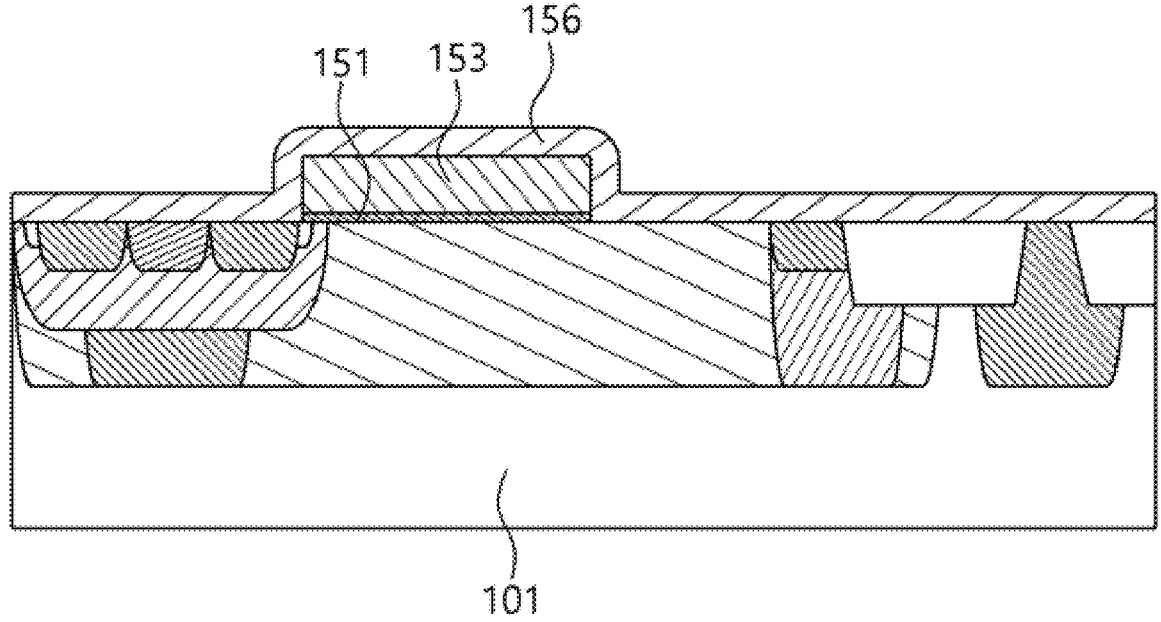
Figure 8:
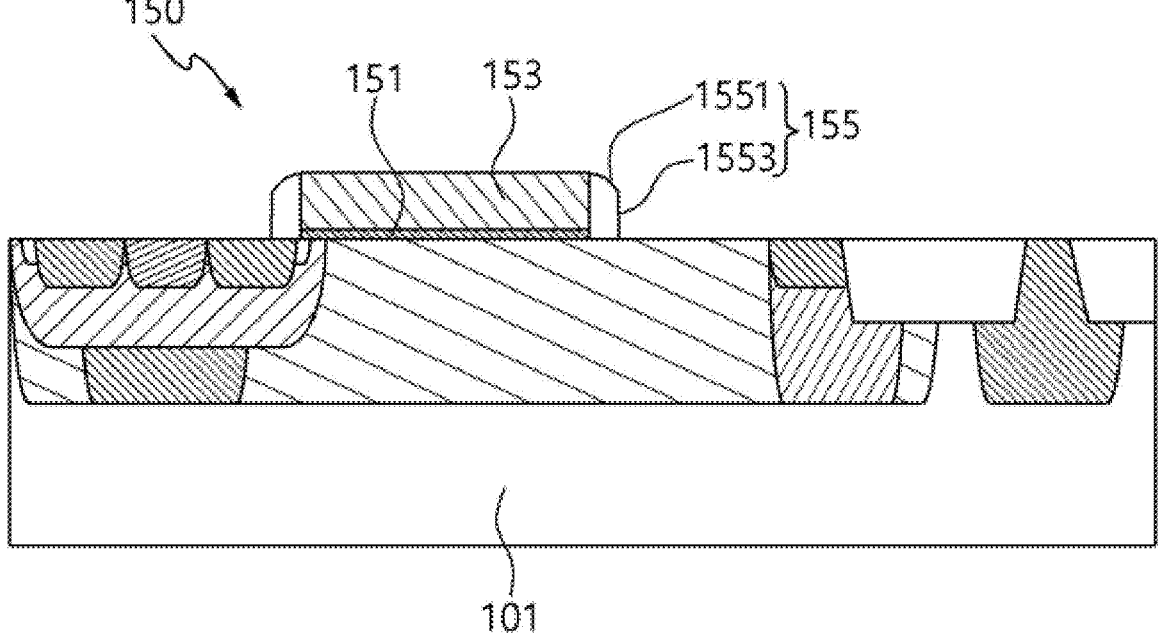

After the formation of the gate electrode 153, a gate spacer 155 may be formed. Referring to FIGS. 7 and 8, the formation of the gate spacer 155 may be achieved by depositing a first insulating film 156 on a surface of the semiconductor layer or substrate 101 and the gate electrode 153. The first insulating film 156 may comprise, for example, a nitride film (e.g., silicon nitride or a silicon dioxide-on-silicon nitride bilayer). Then, the first insulating film 156 may be etched (e.g., anisotropically etched or etched back) to form the gate spacer 155 on each sidewall of the gate electrode 153. The gate spacer 155 may include a first portion 1551 having a relatively small slope (e.g., that gently extends downward) and a second portion 1553 having a relatively large slope (e.g., that extends steeply and obliquely downward).

Figure 9:
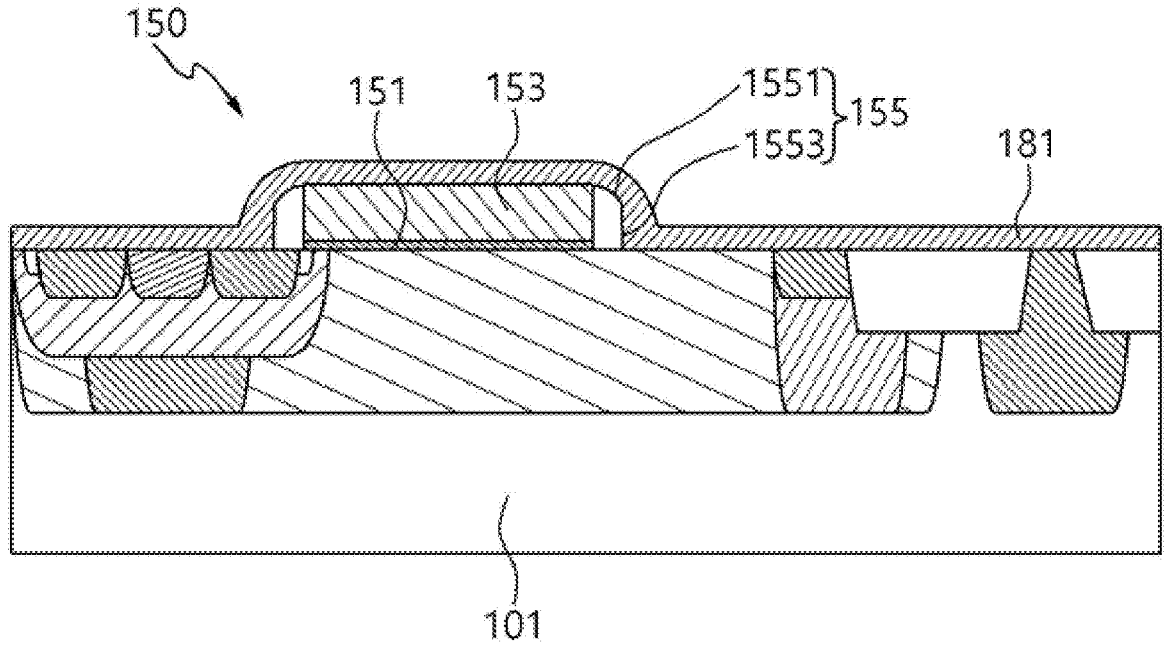
Figure 10:
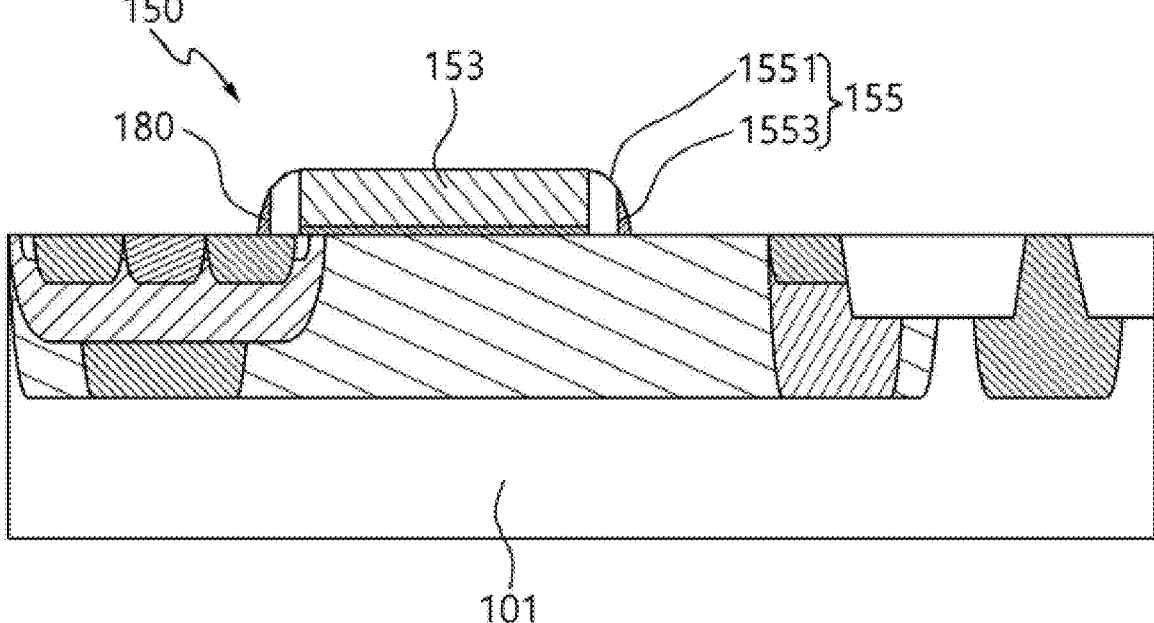

Thereafter, a slope compensating structure 180 may be formed on an outermost surface of the gate spacer 155. This will be described in detail. Referring to FIG. 9, a second insulating film 181 may be deposited on the gate electrode 153, the gate spacer 155, and the exposed semiconductor layer or substrate 101. Here, the second insulating film 181 may have a thickness or height that is greater on or adjacent to the gate spacer 155 than on the gate electrode 153 and the areas of the semiconductor layer or substrate 101 that are not adjacent to the gate spacer 155. Then, referring to FIG. 10, the slope compensating structure 180 may be formed by etching (e.g., anisotropically etching or etching back) the second insulating film 181. As described above, since the second insulating film 181 may have a relatively greater thickness in the area of the semiconductor layer or substrate 101 immediately adjacent to the gate spacer 155 than in other areas, the slope compensating structure 180 may be naturally formed by anisotropic etching, without a separate mask pattern. The slope compensating structure 180 may have a lowermost surface in direct contact with the semiconductor layer or substrate 101.

Figure 11:
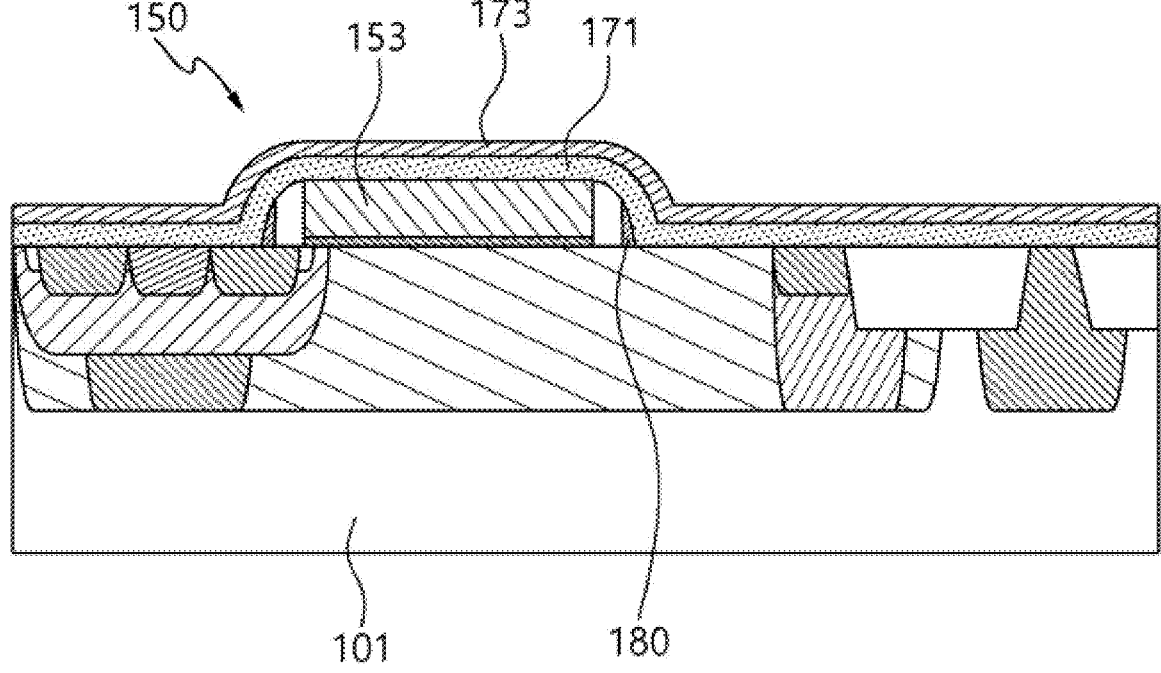

Then, an insulating pattern 170 and a gate field plate 172 may be formed on the gate electrode 153 and the semiconductor layer or substrate 101. This will be described in detail. Referring to FIG. 11, a third insulating film 171 and a plate film 173 may be sequentially deposited or stacked on the gate electrode 153, the gate spacer 155, the slope compensating structure 180, and the semiconductor layer or substrate 101. The third insulating film 171 may comprise, for example, an oxide film (e.g., silicon dioxide) or a nitride film (e.g., silicon nitride), and the plate film 173 may comprise, for example, a polysilicon film.

Figure 12:
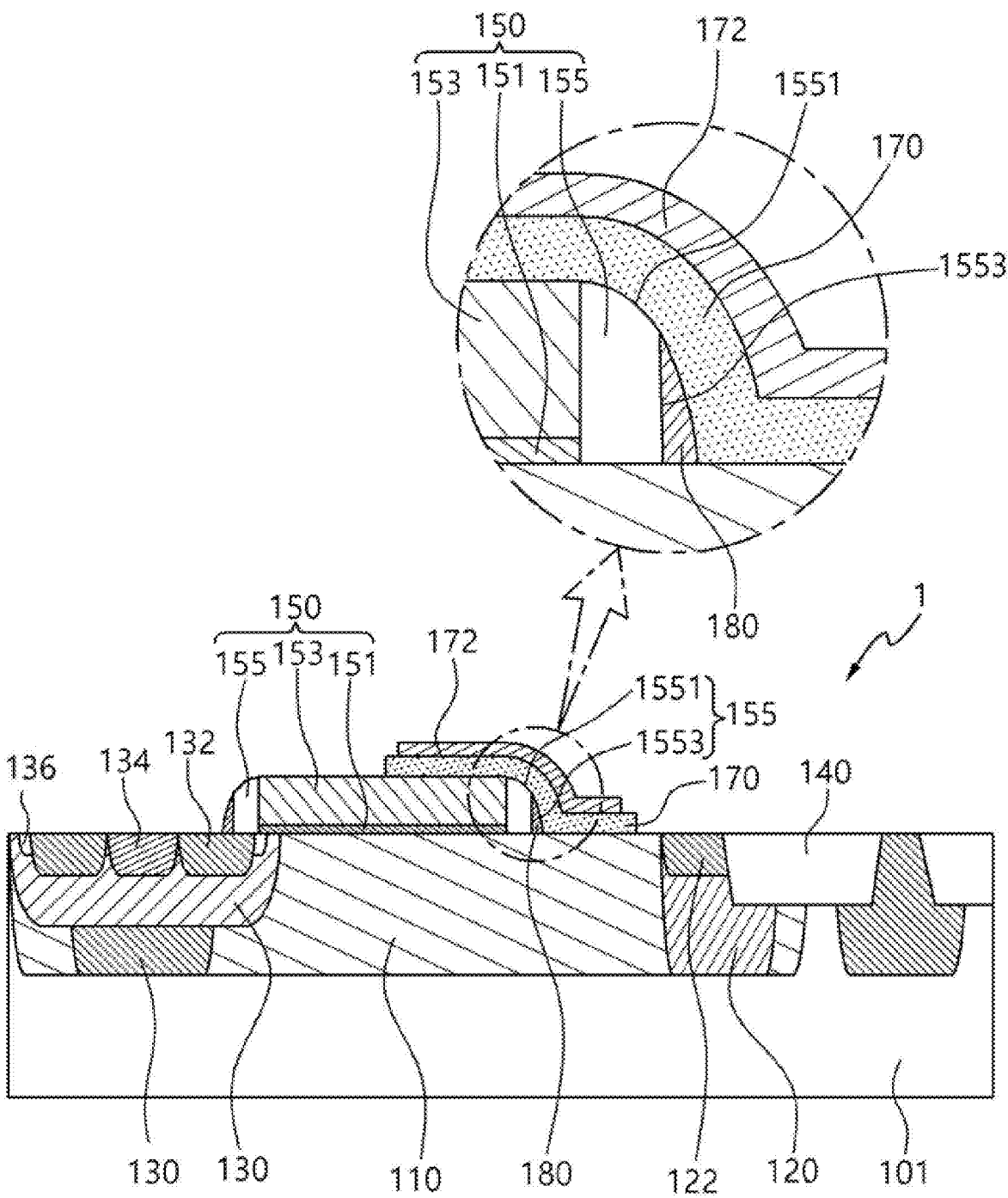

Then, referring to FIG. 12, after forming a mask pattern (not illustrated) on the plate film 173, the plate film 173 and the third insulating film 171 exposed by the mask pattern are etched to form the insulating pattern 170 and the gate field plate 172 having a predetermined shape. An innermost surface of the insulating pattern 170 may have a relatively gentle curved shape and relatively small slope since it is formed on the first portion 1551 of the gate spacer 155 and the slope compensating structure 180, and accordingly, a corner or innermost surface of the gate field plate 172 on the insulating pattern 170 may also have a relatively large angle or a relatively gentle curved shape over the slope compensating structure 180, approaching the uppermost surface of the semiconductor layer or substrate 101.

The foregoing detailed description may be merely an example of the present disclosure. Also, the inventive concept is explained by describing various embodiments and can be used through various combinations, modifications, and environments. That is, the inventive concept may be amended or modified without departing from the scope of the technical idea and/or knowledge in the art. The foregoing embodiments are for illustrating various modes for implementing the technical idea(s) of the present disclosure, and various modifications may be made therein according to specific applications and/or fields of use of the present disclosure. Therefore, the foregoing detailed description of the present disclosure is not intended to limit the inventive concept to the disclosed embodiments.

What is claimed is:

1. A high voltage semiconductor device comprising:
   a semiconductor layer or substrate;
   a gate structure on the semiconductor layer or substrate;
   a slope compensating structure on an outermost surface of the gate structure;
   an insulating pattern on the gate structure and the slope compensating structure; and
   a gate field plate on the insulating pattern,
   wherein the gate structure comprises a gate insulating film on the semiconductor layer or substrate; a gate electrode on the gate insulating film; and a gate spacer on a sidewall of the gate electrode,
   the gate spacer has an outermost surface that comprises a first portion, which is curved, and a second portion extending downward from the first portion with a steeper slope than the first portion,
   the slope compensating structure has an outermost surface with a gentler slope than that of the second portion, and the slope compensating structure does not overlap the first portion laterally and is surrounded by the semiconductor layer or substrate, the insulating pattern, and the gate spacer, and
   each of the slope compensating structure, the insulating pattern, and the gate spacer contacts the semiconductor layer or substrate.

2. The high voltage semiconductor device of claim 1, wherein the slope compensating structure has a vertical length shorter than that of the gate spacer.

3. The high voltage semiconductor device of claim 1, wherein:
   the slope compensating structure is on at least a portion of an outermost surface of the second portion.

4. The high voltage semiconductor device of claim 3, wherein the slope compensating structure comprises an insulating material, and the insulating pattern has a portion extending from a surface of the semiconductor layer or substrate to an upper surface of the gate electrode.

5. The high voltage semiconductor device of claim 1, further comprising:

a drift region in the semiconductor layer or substrate;

a body region in the semiconductor layer or substrate;

a drain in the drift region; and a source in the body region.

6. The high voltage semiconductor device of claim 5, further comprising a drain extension region in the drift region and surrounding the drain.

7. The high voltage semiconductor device of claim 5, further comprising a body contact in the body region and in contact with the source; and an LDD region in the body region and in contact with the source.

8. The high voltage semiconductor device of claim 5, wherein the insulating pattern is in contact with the entire outermost surface of the slope compensating structure.

\*  \*  \*  \*  \*